(12) United States Patent
Wang et al.

(10) Patent No.: US 12,419,016 B2
(45) Date of Patent: Sep. 16, 2025

(54) HIGH-DENSITY POWER SUPPLY

(71) Applicant: Delta Electronics (Shanghai) CO., LTD, Shanghai (CN)

(72) Inventors: Kunpeng Wang, Shanghai (CN); Mingjuan Zhang, Shanghai (CN); Shuailin Du, Shanghai (CN); Kai Dong, Shanghai (CN)

(73) Assignee: Delta Electronics (Shanghai) CO., LTD., Shanghai (CN)

( * ) Notice: Subject to any disclaimer, the term of this patent is extended or adjusted under 35 U.S.C. 154(b) by 302 days.

(21) Appl. No.: 18/163,900

(22) Filed: Feb. 3, 2023

(65) Prior Publication Data
US 2023/0261567 A1    Aug. 17, 2023

(30) Foreign Application Priority Data
Feb. 15, 2022  (CN) .......................... 202210138165.X

(51) Int. Cl.
*H05K 7/20* (2006.01)
*H01F 27/08* (2006.01)
*H02M 3/00* (2006.01)

(52) U.S. Cl.
CPC ....... *H05K 7/20909* (2013.01); *H01F 27/085* (2013.01); *H02M 3/003* (2021.05); *H05K 7/20136* (2013.01); *H05K 7/2089* (2013.01)

(58) Field of Classification Search
CPC ... H02M 3/003; H05K 7/2085; H05K 7/2089; H05K 7/20909; H01F 27/085
See application file for complete search history.

(56) References Cited

U.S. PATENT DOCUMENTS

| | | | |
|---|---|---|---|
| 6,198,642 B1 * | 3/2001 | Kociecki | H02M 1/4225 307/155 |
| 10,143,117 B2 | 11/2018 | Lin | |
| 11,901,108 B2 * | 2/2024 | Zhang | H01F 17/04 |
| 11,953,968 B1 * | 4/2024 | Chou | G06F 1/3253 |

FOREIGN PATENT DOCUMENTS

| | | |
|---|---|---|
| CN | 202231942 U | 5/2012 |
| CN | 106058870 B | 11/2018 |
| CN | 109412389 B | 11/2020 |
| CN | 212231349 U | 12/2020 |

* cited by examiner

*Primary Examiner* — Gary L Laxton
(74) *Attorney, Agent, or Firm* — Qinghong Xu

(57) ABSTRACT

A high-density power supply includes a shell, a fan, a PFC module, a DC-DC module and a main board. The shell has a first air passage and a second air passage arranged side by side. The fan is arranged on an inner side or an outer side of the shell. The PFC module includes a PFC inductor arranged in the first air passage, and the PFC inductor faces directly to the fan. The DC-DC module is arranged in the first air passage. The DC-DC module includes at least one DC-DC conversion circuit, each of the DC-DC conversion circuits includes a first PCB and a transformer magnetic core, a transformer winding and power components arranged on the first PCB. The main board is arranged within the shell. The PFC inductor and the at least one DC-DC conversion circuit are electrically connected with the main board, respectively.

19 Claims, 8 Drawing Sheets

HIGH-DENSITY POWER SUPPLY

CROSS-REFERENCE TO RELATED APPLICATIONS

This application is based on and claims priority to the Chinese application No. 202210138165.X filed on Feb. 15, 2022, the entire contents of which are incorporated herein by reference.

TECHNICAL FIELD

The present disclosure relates to the technical field of power electronics, in particular to a high-density power supply.

BACKGROUND

With the development of science and technology, the data center, as an information infrastructure, is undertaking more and more computation. The power density of the switch power supply applied in data center is also increasing. However, the requirements for the appearance and size of the power supply are gradually becoming standardized. For example, the Common Redundant Power Supply (CRPS) standard specifies two sizes of network power supplies, 185 mm*73.5 mm*40 mm and 265 mm*73.5 mm*40 mm as d by.

Taking the 185 mm long CRPS power supply as an example, the components inside an input power supply of 2400 W AC are very densely arranged. Most of the space inside the power supply is occupied by transformers and inductors, which leads air blockage and poor heat dissipation effect. If the power of the power supply is increased to 3 KW, it will be difficult or even impossible to arrange large components, and the heat dissipation of the power supply will become more serious.

SUMMARY

An objection of the present disclosure is to provide a high-density power supply with good heat dissipation performance and small volume.

A high-density power supply includes a shell, a fan, a PFC module, a DC-DC module and a main board. The shell has a first air passage. The fan is arranged on an inner side or an outer side of the shell. The PFC module includes a PFC inductor arranged in the first air passage, and the PFC inductor faces directly to the fan. The DC-DC module is arranged in the first air passage. The DC-DC module includes at least one DC-DC conversion circuit, each of the DC-DC conversion circuits includes a first PCB and a transformer magnetic core, a transformer winding and power components arranged on the first PCB, wherein the transformer magnetic core and the transformer winding together form a transformer. The main board is arranged within the shell. The PFC inductor and the at least one DC-DC conversion circuit are electrically connected with the main board, respectively.

The present disclosure has at least following advantages or beneficial effects: the high-density power supply of the present disclosure can save the internal space of the power supply, for benefit for the miniaturization of the product and improve the heat dissipation effect of the power supply by using a modular DC-DC conversion circuit and optimizing the arrangement of the components. From the other point of view, on the premise of meeting the appearance size and heat dissipation, the power density can be increased by 30% compared with the traditional network power supply.

BRIEF DESCRIPTION OF THE DRAWINGS

The above-described and other features and advantages of the present disclosure will become more apparent from the detailed descriptions of typical embodiments with reference with the accompanying drawings.

DETAILED DESCRIPTION

Now, the typical embodiments will be described more completely with reference to the accompanying drawings. However, the typical embodiments can be done in various forms and should not be construed as limiting the embodiments as set forth herein. Instead, these embodiments are provided so that the present disclosure will be thorough and complete, and concept of the typical embodiments will be fully conveyed to those skilled in the art. Same reference numbers denote the same or similar structures in the figures, and thus the detailed description thereof will be omitted.

Figure 1:
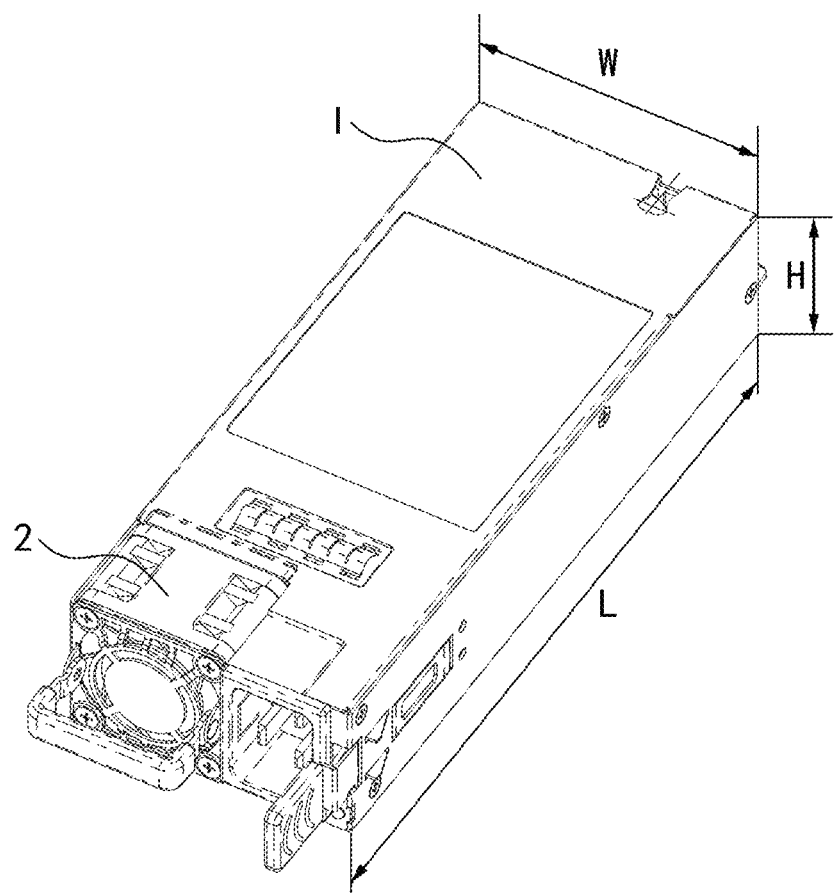
FIG. 1 is a three-dimensional structure view of the first embodiment of the high-density power supply of the present disclosure.

Referring to FIG. 1 in which an appearance structure of a typical embodiment of a high-density power supply of the present disclosure is shown. In this embodiment, the high-density power supply proposed by the present disclosure has a length of 185 mm, a width of 73.5 mm and a height of 40 mm in conformity with the appearance dimension specified by the CRPS. Of course, in some other embodiments, the apparent dimension of high-density power supply may also be other dimensions, such as 265 mm*73.5 mm*40 mm, or 185 mm*73.5 mm*39 mm.

Figure 2:
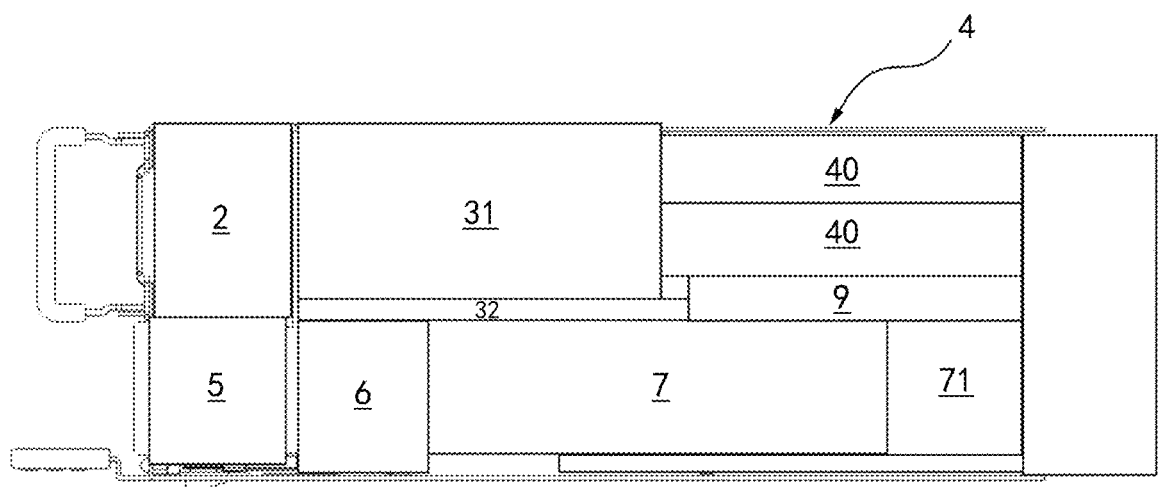
FIG. 2 is a schematic view of an arrangement mode of respective modules in the high-density power supply of the present disclosure.
Figure 3:
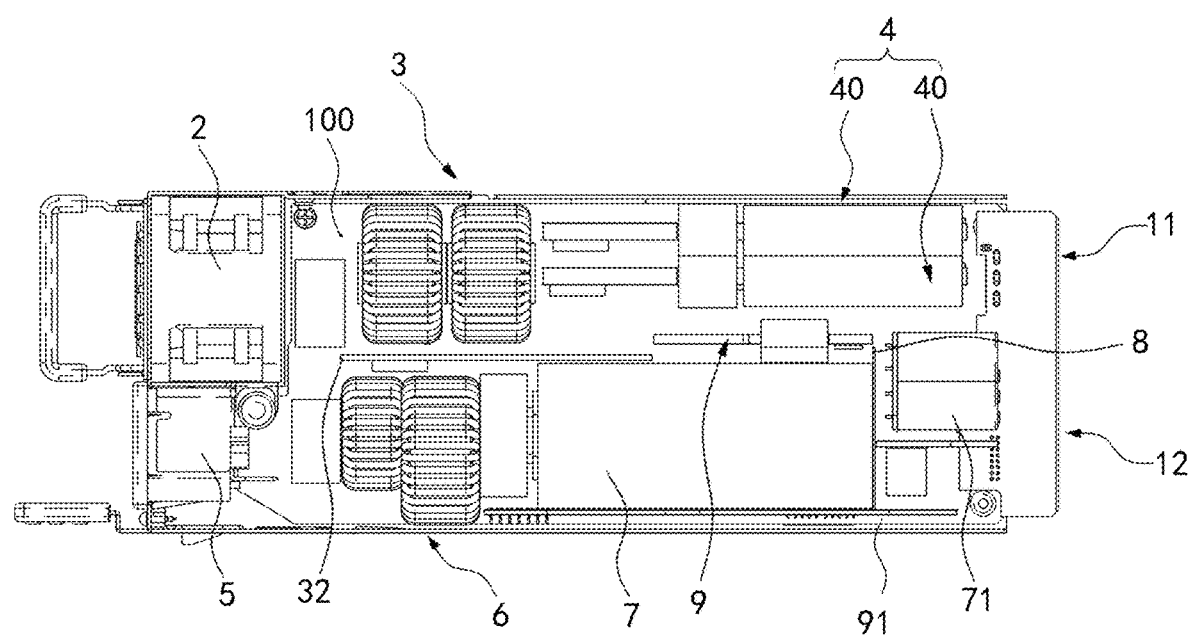
FIG. 3 is a schematic view of an internal structure of the high-density power supply of the present disclosure.

Referring to FIGS. 1, 2, and 3. FIG. 2 is a schematic view of an arrangement mode of respective modules in the high-density power supply of the present disclosure. FIG. 3 is a schematic view of an internal structure of the high-density power supply of the present disclosure. The high-density power supply of the present disclosure comprises a shell 1, a fan 2, a PFC module 3, a DC-DC module 4, an input connector 5, an EMI filter unit 6, a bus capacitor 7 and a main board 100. The PFC module 3 includes a PFC inductor 31 and a PFC circuit board 32, wherein some power components are positioned on the PFC circuit board 32. The main board 100 is arranged within the shell 1. The PFC inductor 31, the PFC circuit board 32, the DC-DC module 4, the EMI filter unit 6 and the bus capacitor 7 are arranged on the main board 100. Each of the PFC inductor 31, the PFC circuit board 32, the DC-DC module 4, the input connector 5, the EMI filter unit 6, and the bus capacitor 7 are electrically connected with the main board 100.

As shown in FIG. 1, the fan 2 is mounted on the outside of the shell 1, i.e., exposed outside the shell 1. In some other embodiments, the fan 2 may also be mounted inside the shell 1, i.e., the fan 2 is completely or partially enclosed therein. In some embodiments, the fan 2 is electrically connected with the main board 100.

As shown in FIG. 2 and FIG. 3, a space within the shell 1 is defined as a first air passage 11 and a second air passage 12 arranged side by side. The PFC inductor 31 and the DC-DC module 4 are successively arranged on the first air passage 11 from forward to backward. The PFC inductor 31 directly faces to the fan 2. The fan 2 is installed in front of the first air passage 11, that is, in front of the PFC inductor 31. The EMI filter unit 6 and the bus capacitor 7 are successively arranged in the second air passage 12 from forward to backward. In this way, an air flow is directed into the first air passage 11 as far as possible, to provide good heat dissipation for the PFC inductor 31 and the power components on the DC-DC module 4, so as to improve heat dissipation efficiency. In some embodiments, the PFC inductor 31 includes a PFC magnetic core with a central through-hole, the central through-hole of the PFC magnetic core faces to the fan 2 to direct the air flow as far as possible to the DC-DC module 4, to provide good heat dissipation for the power components on the DC-DC module 4, so as to improve the heat dissipation efficiency. In some embodiments, an input connector 5 may be arranged in front of the EMI filter unit 6. An insulation sheet 8 may be pasted to a rear end of the bus capacitor 7, to optimize the air passage. In line with the improvement of the output power of the power supply, the bus capacitor 7 generally employs a large-capacity Bulk capacitor. An output capacitor 71 may be arranged behind the bus capacitor 7 and is electrically connected with the main board 100.

As shown in FIG. 3, in some embodiments, the PFC circuit board 32 is vertically arranged on the main board 100, and it is benefit to save the space of the power supply. In some embodiments, the PFC inductor 31 may be located between the PFC inductor 31 and the EMI filter unit 6, so that the power components on the PFC circuit board 32 are positioned in the first air passage 11 to the maximum extent, and thereby improving the heat dissipation efficiency of the power supply.

Figure 4:
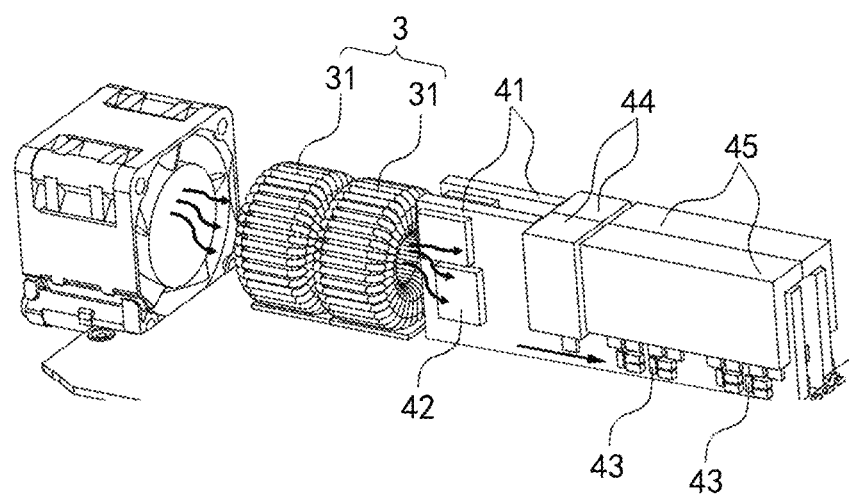
FIG. 4 is a schematic structure view of a PFC inductor and a DC-DC module in the high-density power supply of the present disclosure.

FIG. 4 shows the structure of the PFC inductor and the DC-DC module in the high-density power supply. The PFC inductor 31 of the present disclosure is arranged between the fan 2 and the DC-DC module 4, and the central through-hole 30 of a PFC magnetic core of the PFC inductor 31 directly faces to the fan 2, so that a wind generated by fan 2 blows towards the PFC inductor 31, and blows directly through the central through-hole 30 to the DC-DC module 4 in the rear.

The PFC inductor 31 includes a PFC magnetic core with the central through-hole 30 and a PFC winding wound around the PFC magnetic core.

Figure 5A:
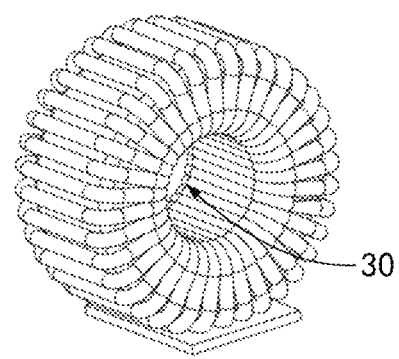
FIG. 5A is a schematic structure view of one PFC inductor in the high-density power supply of the present disclosure.

As shown in FIG. 5A, the PFC magnetic core in the PFC inductor 31 is presented in the shape of a circular ring, and the PFC winding is wound on the PFC magnetic core.

Figure 5B:
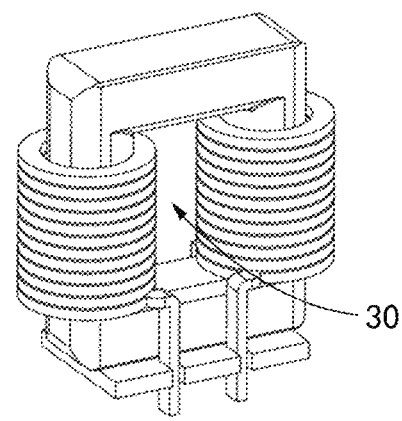
FIG. 5B shows a schematic view of another PFC inductor in the high-density power supply of the present disclosure.

As shown in FIG. 5B, the PFC magnetic core in the PFC inductor 31 is presented in a rectangular shape, and the PFC windings are wrapped around two opposite magnetic columns of the rectangular PFC magnetic core.

In some other embodiments, the shape of the PFC magnetic core in the PFC inductor 31 is not limited to the circular ring or rectangle as listed above. It may also be a closed ring with a central through-hole, such as a runway shape, or even an un-closed ring with a central through-hole, such as a C-shape.

Referring to FIG. 4, the DC-DC module 4 of the present disclosure includes at least one DC-DC conversion circuit. In this embodiment, the DC-DC conversion circuit is a LLC resonant circuit 40. In the embodiment as shown in FIG. 3, two LLC resonant circuits 40 are shown. In some other embodiments, the number of LLC resonant circuits 40 may also be only one or three, four and so on, which may be determined depending on the factors such as the power density of the power supply. It should be understood for a person skilled in the art that in other embodiments, the DC-DC conversion circuit may also adopt a circuit structure other than the LLC resonant circuit described above.

The LLC resonant circuit 40 includes a first PCB 41 and a transformer magnetic core 45, transformer windings, and a plurality of power components such as a Metal Oxide Semiconductor Field Effect transistor (MOSFET) and an Insulated Gate Bipolar Transistor (IGBT) or a gallium nitride (GaN) arranged on the first PCB 41. The power components arranged on the first PCB 41 and other components such as ceramic capacitors all use surface-mounted devices (SMD). The transformer magnetic core 45 and the transformer windings together form a transformer, such as a plane transformer; part of the power components 42 and a wiring in the PCB 41 together form a primary circuit, and the other part of the power component 43 and the wiring in the PCB 41 together form a secondary circuit.

The first PCB 41 may be in a rectangular shape, and may have a top side, a bottom side opposite to the top side, a left side and a right side opposite to the left side. The transformer magnetic core 45 extends from the right side to the left side, and from the top side to the bottom side of the first PCB 41. Part of the power components 42 may be adjacent to a left side of the first PCB 41. Another part of the power components 43 may be adjacent to a bottom side of the first PCB 41. The power components 43 may be positioned below the transformer magnetic core 45. A relative height between the power components and the first PCB 41 is not higher than a relative height between the transformer magnetic core 45 and the first PCB 41, such that more wind can be guided towards below the transformer magnetic core 45, thereby optimizing the air passage below the first PCB 41, and providing a heat dissipation effect of the power components 43 below the transformer magnetic core 45.

As shown in FIG. 4, the DC-DC module 4 of the present disclosure includes two LLC resonant circuits 40. The two first PCBs 41 are arranged side by side, to make the air passages on either side of the two first PCB 41 smooth, so as to ensure that the power supply can have sufficient air flow for the heat dissipation and thus meet the need for heat.

As shown in FIG. 4, the LLC resonant circuit 40 further includes an inductor magnetic core 44 and an inductor winding arranged on the first PCB 41. The inductor magnetic core 44 and the inductor winding together form a resonant inductor. The inductor magnetic core 44 and the transformer magnetic core 45 may be arranged side by side, and the inductor magnetic core 45 is positioned on the left side of the transformer magnetic core 45. The power components 43 may be positioned under the inductor magnetic core 44 and the transformer magnetic core 45.

In some embodiments, the inductor magnetic core 44 and the transformer magnetic core 45 are two separate magnetic cores. In some other embodiments, the inductor magnetic core 44 and the transformer magnetic core 45 are an integrated magnetic core.

In some embodiments, in case that the DC-DC module 4 includes a plurality of LLC resonant circuits 40, the inductor magnetic cores 44 of the plurality of LLC resonant circuits 40 are integrated magnetic cores or discrete magnetic cores, and the transformer magnetic cores 45 of the plurality of LLC resonant circuits 40 are integrated magnetic cores or discrete magnetic cores. In some other embodiments, when the DC-DC module 4 includes a plurality of LLC resonant circuits 40, the inductor magnetic cores 44 and the transformer magnetic cores 45 of the plurality of LLC resonant circuits 40 are integrated magnetic cores.

Therefore, in the present disclosure, the resonant inductor, the transformer and the power components are integrated on the first PCB 41, and the windings of the resonant inductor and the transformer are formed on the first PCB 41, so that the appearance dimension of the power supply can be reduced while ensuring the power density. In some embodiments, the inductor magnetic core 44 and the transformer magnetic core 45 are an integrated magnetic core. In some other embodiments, the inductor magnetic core 44 and the transformer magnetic core 45 are magnetic cores independent to each other.

In some other embodiments, only the transformer and part of the power components may be integrated on the first PCB 41.

Figure 6:
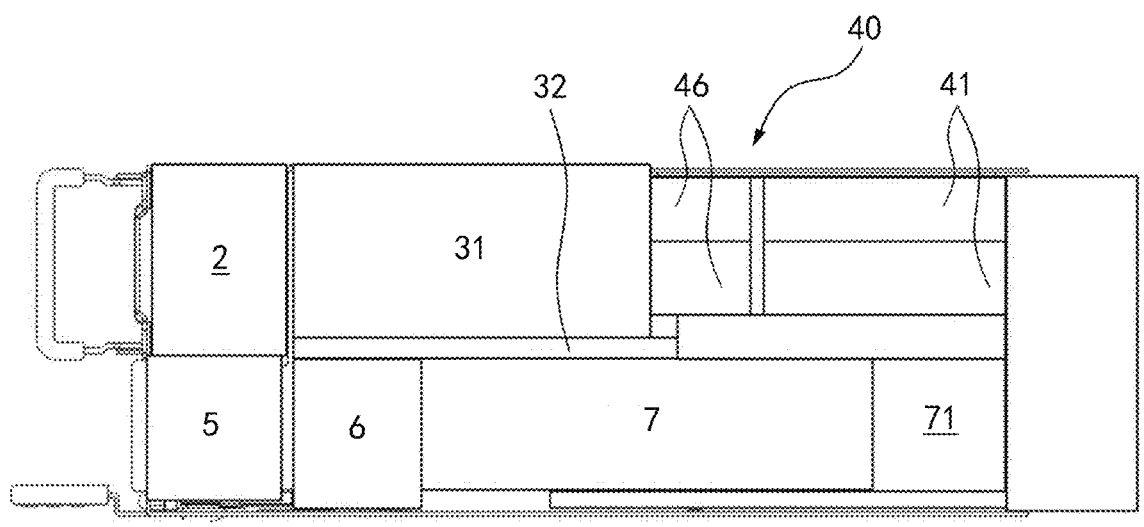
FIG. 6 is a schematic view of another arrangement mode of respective modules in the high-density power supply of the present disclosure.

Referring to FIG. 6 which is a schematic view of another arrangement mode of respective modules in the high-density power supply of the present disclosure. The difference thereof from the arrangement mode of the respective modules as shown in FIG. 2 are in that the LLC resonant circuit 40 further includes a second PCB 46 which may be arranged between the PFC inductor 31 and the first PCB 41. In other embodiments, it is required that the second PCB 46 may be arranged in front of the PFC inductor 31. In the embodiment as shown in FIG. 6, the power components 42 may be arranged on the second PCB 46 and positioned in the first air passage 11. The power components 42 and a wiring in the second PCB 46 together form a primary circuit of the LLC resonant circuit. The power components 43 may still be arranged on the first PCB 41 and form a secondary circuit of the LLC resonant circuit together with the wiring in the first PCB 41. Therefore, in this embodiment, the power components in the LLC resonant circuit 40 may be arranged on different PCBs, so that the power components 42 on the second PCB 46 and the power components 43 on the first PCB 41 are in the first air passage 11 to the maximum extent so as to improve the heat dissipation efficiency of the power supply.

In some other embodiments, the power components 42 are arranged on a main board 100 and form a primary circuit together with the wiring in the main board 100, and the power components 42 are arranged between the PFC inductor 31 and the first PCB 41.

In some other embodiments, the high-density power supply further includes an auxiliary power supply unit 9. The auxiliary power supply may be arranged parallel to a centerline of a bus capacitor 7 and is positioned between the bus capacitor 7 and the DC-DC module 4. In addition to a function of supplying power, the auxiliary power supply unit 9 may also be used to assist in separating the first air passage 11 and the second air passage 12, which can facilitate directing the air to the first air passage 11 and thus improve the heat dissipation efficiency.

In some other embodiments, the high-density power supply further includes a control plate 91. The control plate 91 is arranged on one side of the bus capacitor 9, for example between the shell and the bus capacitor 7. The control plate is electrically connected with the main board, for controlling an action of the power components on the PFC circuit board 32 and the power components of the LLC resonant circuit 40. The control plate 91 may be arranged parallel with the bus capacitor 7, that is, a center line of the bus capacitor 7 is parallel to the control plate 91, which can reduce the space of the high-density power supply and effectively solve the difficulty of placing the internal components in the high-density power supply. In some other embodiments, the control plate 91 may be arranged according to actual requirements, and is not limited thereto.

The present disclosure uses the above DC-DC module 4 to replace the existing independent devices such as the transformer, the resonant inductor, and the power components, etc., which can save the space in the width direction of high-density power supply. The auxiliary power supply unit 9 is arranged between the bus capacitor 6 and the DC-DC module 4, and the auxiliary power supply unit 9 may be arranged parallel with the bus capacitor 6 and/or parallel to the first PCB 41 in the DC-DC module, which can reduce the space of the high-density power supply in the length direction and effectively solve the difficulty of placing the internal components of the high-density power supply.

As shown in FIG. 3, a power transmission path inside the high-density power supply of the present disclosure is as follows:

An input electric energy is first connected to the high-density power supply through an input connector 5, and then connected to the PFC inductor 31 through an EMI filter module 6. The PFC inductor 31 and other power components on the PFC circuit board 32 form a PFC module. The electrical energy, after being rectified by the power components on the PFC circuit board 32, is connected to the DC-DC conversion circuit 40 such as the LLC resonant circuit. The LLC resonant circuit 40 may be a full-bridge LLC DC-DC topology, and the electrical energy is finally output to the outside of the high-density power supply through the LLC resonant circuit 40.

In the high-density power supply, heating components are mainly concentrated in the PFC inductor 31, the power components on the PFC circuit board 32, the power components of the primary circuit and the secondary circuit of the LLC resonant circuit 40, and the resonant inductor and the transformer of the LLC resonant circuit 40.

In the present disclosure, the PFC inductor 31 and the DC-DC module 4 are arranged in the first air passage 11 where the fan 2 is positioned, and the PFC circuit board 32 is arranged in a position close to the fan 2, so that a large amount of air can be brought for the power components on the PFC circuit board 32; and passive components that generate less heat, such as the EMI filter unit 6 and the bus capacitor 7 are arranged in the second air passage 12 and positioned behind the input connector 5, the EMI filter unit 6 and the bus capacitor 7 direct part of the air flow to the first air passage 11, to improve the heat dissipation efficiency of the PFC inductor 31, the DC-DC module 4, and the respective power components.

Specifically, the PFC inductor 31 of the PFC module 3 is arranged behind the fan 2 at a distance from the fan 2. The air of the fan 2 blows directly to the PFC inductor 31 to take away the heat generated by the PFC inductor 31. The PFC circuit board 32 of the PFC module 3 is arranged between the PFC inductor 31, the EMI filter unit 6, and the bus capacitor 7. The power components on the PFC circuit board 32 are exposed and can be directly blown by the air of the fan 2. Therefore, it is sufficient for the heat dissipation of the PFC module 3 of the present disclosure. In some embodiments, the PFC magnetic core of the PFC inductor 31 has a central through-hole 30, through which the air of the fan 2 flows, and can be blown directly to the DC-DC module 4 behind the PFC inductor 31, to take away the heat generated by the PFC inductor 31 and direct the air flow to the DC-DC module 4.

The air through the central through-hole 30 of the PFC inductor 31 can be blown directly to the LLC resonant circuit 40 of the DC-DC module 4 in the rear, the power components 42 in the primary circuit of the LLC resonant circuit 40 are arranged on the left side of the transformer magnetic core, and the power components 43 in the secondary circuit of the LLC resonant circuit 40 are arranged under the transformer magnetic core, so that the air can be directly blown into the transformer magnetic core, but also directly blown into these power components 42 and 43 for the heat dissipation. Therefore, it is sufficient for the heat dissipation of the LLC resonant circuit 40 of the present disclosure. And, a height of the power components 42 and 43 is not higher than a height of the transformer magnetic core of the LLC resonant circuit 40, especially when the power components 43 adopt surface-mounted devices (SMD), the height is significantly lower than that of the transformer magnetic core, the transformer magnetic core of the LLC resonant circuit 40 can direct more air flow to the power components 43, to improve the heat dissipation efficiency of the power components 43 under the transformer magnetic core and make the air flow smooth. Therefore, the configuration of the components in the present disclosure can ensure the heat dissipation effect of the whole high-density power supply.

Figure 7:
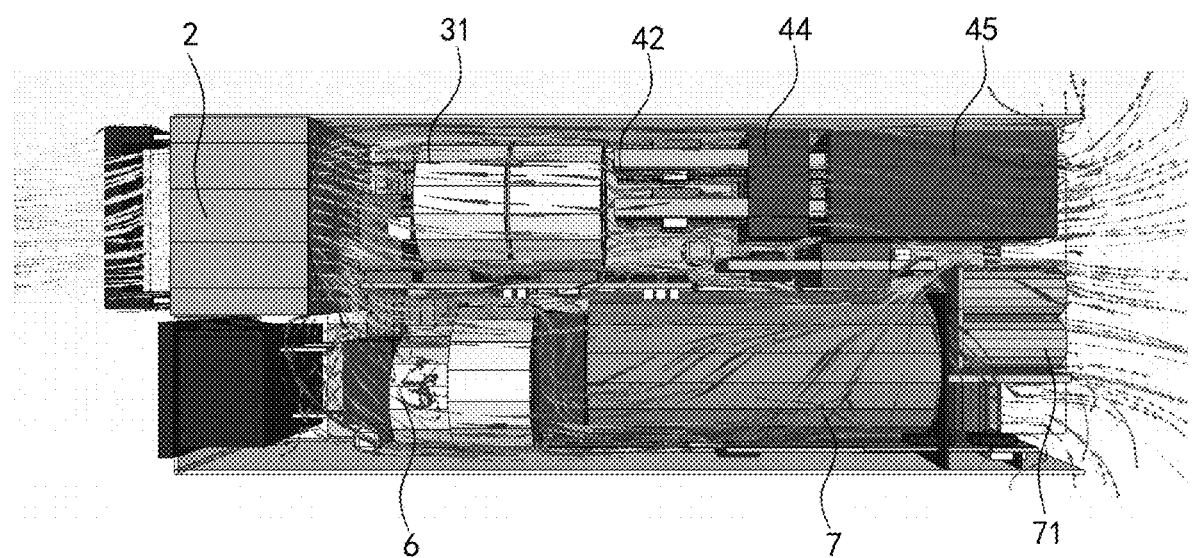
FIG. 7 is a simulation view of heat dissipation air flow in the high-density power supply of the present disclosure.

Referring to FIG. 7 which illustrates a simulation view of the heat dissipation air flow in the high-density power supply of the present disclosure. As can be seen from FIG. 7, an amount of the air flowing through the first air passage with high heat generation above the interior of the high-density power supply is greater than an amount of the air flowing through the second air passage with low heat generation there below.

In the description of embodiments of the present disclosure, the terms "amount", "connect", "engage" and "fix" shall be broadly understood, for example, "connect" may be fixed connection, detachable connection or integral connection; the terms "connection" may be direct connection, or indirect connection through an intermediate media. For the person skilled in the art, the specific meanings of the above terms in the embodiments of the present disclosure can be understood depending on specific context.

In the description of the embodiments of the present disclosure, it is to be understood that orientation or position relation of the terms "upper", "lower", "left" and "right" and so on refers to the orientation or position relation as illustrated based on the accompanying drawings, only for convenience of describing the embodiments of the preset disclosure and simplifying the description, but not to indicate or imply that the device or unit must have a specific direction, be constructed and operated in a specific orientation, it thus cannot be understood as limiting the embodiments of the present disclosure.

In the description of the specification, the description of the terms "one embodiment", "some embodiments", and "specific embodiments" and so on refers to the specific features, structures, materials or characteristics in combination with the embodiments or the exemplary description are included in the at least one embodiment or example of the present disclosure. In this specification, the schematic representation of the term does not necessarily refer to the same embodiment or example. Further, the specific features, the structures, the materials or the characteristics can be combined in any one or more embodiments or examples in a suitable manner.

The above is only preferred embodiments of the present disclosure, but not used for limiting the embodiments of the present disclosure. For the person skilled in the art, the embodiments of the present disclosure may have various modifications and changes. Any modification, equivalent substitution, improvement and so on within a spirit and principle of the present disclosure are included in a protection scope of the present disclosure.

What is claimed is:

1. A high-density power supply, comprising:
   a shell with a first air passage;
   a fan arranged on an inner side or an outer side of the shell;
   a power factor correction (PFC) module comprising a PFC inductor, wherein the PFC inductor is arranged in the first air passage, and the PFC inductor faces directly to the fan;
   a direct current to direct current (DC-DC) module arranged in the first air passage, wherein the direct current to direct current (DC-DC) module is located on a side of the PFC inductor away from the fan in an exhaust direction of the fan, and wherein the DC-DC module comprises at least one DC-DC conversion circuit, each of the DC-DC conversion circuits comprises a first PCB and a transformer magnetic core, a transformer winding and power components, and the transformer magnetic core, the transformer winding and the power components are arranged on the first PCB, and the transformer magnetic core and the transformer winding together form a transformer;
   a main board arranged within the shell, wherein the PFC inductor and the at least one DC-DC conversion circuit are electrically connected with the main board, respectively.

2. The high-density power supply according to claim 1, wherein the DC-DC conversion circuit is a LLC resonant circuit.

3. The high-density power supply according to claim 1, wherein the first PCB has a top side, a bottom side opposite to the top side, a left side and a right side opposite to the left side, the transformer magnetic core extends from the right side to the left side and from the top side to the bottom side of the first PCB, and the power components are adjacent to the left side and the bottom side of the first PCB.

4. The high-density power supply according to claim 3, wherein a relative height between the power components and the first PCB is not higher than a relative height between the transformer magnetic core and the first PCB.

5. The high-density power supply according to claim 2, wherein each of the LLC resonant circuits further comprises an inductor magnetic core and an inductor winding, and the inductor magnetic core and the inductor winding are arranged on the first PCB, and the inductor magnetic core and the inductor winding together form a resonant inductor.

6. The high-density power supply according to claim 1, wherein the PFC inductor is positioned between the fan and the DC-DC module.

7. The high-density power supply according to claim 1, wherein the PFC inductor comprises a PFC magnetic core with a central through-hole, and the central through-hole of the PFC magnetic core faces directly to the fan.

8. The high-density power supply according to claim 7, wherein the shape of the magnetic core of the PFC inductor is a circular ring or a rectangle.

9. The high-density power supply according to claim 1, wherein each of the DC-DC conversion circuits further comprises a second PCB and power components arranged on the second PCB.

10. The high-density power supply according to claim 9, wherein the second PCB is positioned between the PFC inductor and the first PCB.

11. The high-density power supply according to claim 1, wherein the shell further comprises a second air passage arranged side by side with the first air passage, the high-density power supply further comprises an EMI filter unit and a bus capacitor, and the EMI filter unit and the bus capacitor are arranged in the second air passage, and the EMI filter unit and the bus capacitor are electrically connected with the main board, respectively.

12. The high-density power supply according to claim 11, wherein the PFC module further comprises a PFC circuit board, and the PFC circuit board is positioned between the PFC inductor and the EMI filter unit.

13. The high-density power supply according to claim 11, further comprising an auxiliary power supply unit positioned between the bus capacitor and the DC-DC module.

14. The high-density power supply according to claim 13, wherein the auxiliary power supply unit is arranged parallel with the bus capacitor.

15. The high-density power supply according to claim 11, wherein the bus capacitor is arranged parallel with the main board.

16. The high-density power supply according to claim 11, further comprising a control plate for controlling the power components on the PFC circuit board and the power components on the at least one DC-DC conversion circuit, wherein the control plate is arranged on one side of the bus capacitor and is electrically connected with the main board.

17. The high-density power supply according to claim 1, wherein the high-density power supply has a dimension of 185 mm*73.5 mm*40 mm, 265 mm*73.5 mm*40 mm or 185 mm*73.5 mm*39 mm.

18. The high-density power supply according to claim 5, wherein the inductor magnetic core and the transformer magnetic core are arranged side by side, and the inductor magnetic core is positioned on a left side of the transformer magnetic core.

19. The high-density power supply according to claim 5, wherein the inductor magnetic core is integrated with the transformer magnetic core.

* * * * *